(12) United States Patent
Jansen et al.

(10) Patent No.: US 8,866,540 B2
(45) Date of Patent: Oct. 21, 2014

(54) BIASING IN CMOS INVERTER

(75) Inventors: Richard Jan Engel Jansen, Oegstgeest (NL); Jan Hendrik Haanstra, Nijmegen (NL)

(73) Assignee: GreenPeak Technologies B.V., Utrecht (NL)

( * ) Notice: Subject to any disclaimer, the term of this patent is extended or adjusted under 35 U.S.C. 154(b) by 0 days.

(21) Appl. No.: 14/122,888

(22) PCT Filed: May 30, 2011

(86) PCT No.: PCT/NL2011/050379
§ 371 (c)(1),
(2), (4) Date: Dec. 24, 2013

(87) PCT Pub. No.: WO2012/165941
PCT Pub. Date: Dec. 6, 2012

(65) Prior Publication Data
US 2014/0103992 A1   Apr. 17, 2014

(51) Int. Cl.
*G05F 1/10*   (2006.01)
*G05F 3/02*   (2006.01)

(52) U.S. Cl.
USPC .......................................... 327/543; 327/541

(58) Field of Classification Search
USPC ........... 327/538–540, 541, 543; 323/313, 315
See application file for complete search history.

(56) References Cited

U.S. PATENT DOCUMENTS

| 6,812,590 B2 * | 11/2004 | Lee et al. .................. 307/33 |
| 2009/0251227 A1 | 10/2009 | Jasa |
| 2013/0093504 A1 * | 4/2013 | Nag et al. ................. 327/539 |

FOREIGN PATENT DOCUMENTS

| DE | 39 06 482 | 9/1990 |
| EP | 0 541 242 | 5/1993 |

OTHER PUBLICATIONS

International Search Report dated Nov. 10, 2011, corresponding to PCT/NL2011/050379.
Behzad Razavi; Chapter 9; "Design of Analog CMOS Integrated Circuits", McGraw-Hill, 2001.
Bram Nauta; "A CMOS Transconductance-C Filter Technique for Very High Frequencies"; IEEE Journal of Solid-State Circuits, vol. 27, No. 2; Feb. 1992.

* cited by examiner

*Primary Examiner* — Quan Tra
(74) *Attorney, Agent, or Firm* — Young & Thompson

(57) ABSTRACT

Biasing circuit for providing a supply voltage (Vdd) for an inverter based circuit. The biasing circuit is provided on a same die as the inverter based circuit, and includes a first shorted inverter circuit (T1, T2) and a second shorted inverter circuit (T3, T4). The first shorted inverter circuit (T1, T2) is connected in parallel to a series configuration of the second shorted inverter circuit (T3, T4) and a reference impedance (R). The first shorted inverter circuit (T1, T2) and second shorted inverter circuit (T3, T4) have different transistor geometries. A control circuit (T5-T11) is connected to the first shorted inverter circuit (T1, T2) and the second shorted inverter circuit (T3, T4), and supplied with a main supply voltage (Vdd). The control circuit (T5-T11) is arranged such that an equal current flows through the first shorted inverter circuit (T1, T2) and second shorted inverter circuit (T3, T4).

14 Claims, 2 Drawing Sheets

BIASING IN CMOS INVERTER

FIELD OF THE INVENTION

The present invention relates to a biasing circuit for providing a supply voltage for an inverter based circuit. In a further aspect, the present invention relates to a combination of a biasing circuit and an inverter based circuit.

PRIOR ART

American patent publication US2009/0251227 discloses a constant gm circuit that generates a bias current for an emitter/source coupled multivibrator oscillator. Current sources are provided such that the gm parameter value of the multivibrator transistors are constant with variation of temperature and the fabrication process of the oscillator.

In chapter 9 of the book by Behzad Razavi, 'Design of Analog CMOS Integrated Circuits', McGraw-Hill, 2001, the concept of constant gm current biasing of NMOS transistors is described. A current is generated which can be copied and used to bias an NMOS transistor such that the gm parameter (transconductance) of the NMOS transistor depends only on a reference resistor.

SUMMARY OF THE INVENTION

The present invention seeks to provide an improved biasing circuit which is easy to manufacture and easy to integrate in current integrated circuit designs.

According to the present invention, a biasing circuit according to the preamble defined above is used, wherein the biasing circuit is provided on a same die as the inverter based circuit, the biasing circuit comprising a first shorted inverter circuit and a second shorted inverter circuit, wherein the first shorted inverter circuit is connected in parallel to a series configuration of the second shorted inverter circuit and a reference impedance, and the first shorted inverter circuit and second shorted inverter circuit have different transistor geometries, further comprising a control circuit connected to the first shorted inverter circuit and the second shorted inverter circuit, and supplied with a main supply voltage, the control circuit being arranged such that an equal current flows through the first shorted inverter circuit and second shorted inverter circuit.

No additional control loops are needed, which makes this biasing circuit very efficient and easy to integrate. No temperature dependency is present anymore when this biasing circuit is used in combination with an inverter based circuit.

SHORT DESCRIPTION OF DRAWINGS

Figure 1:
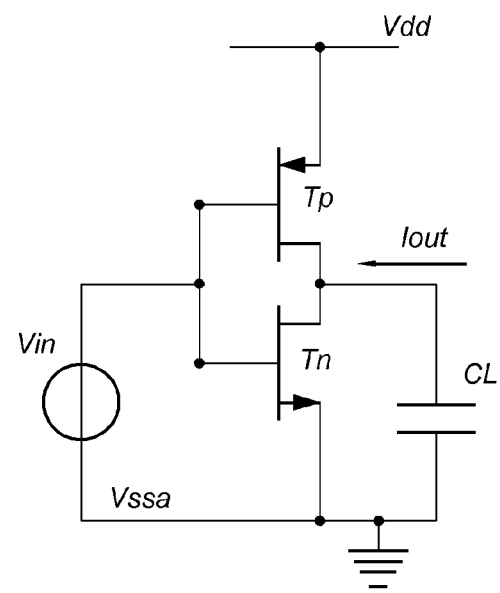
Figure 2:
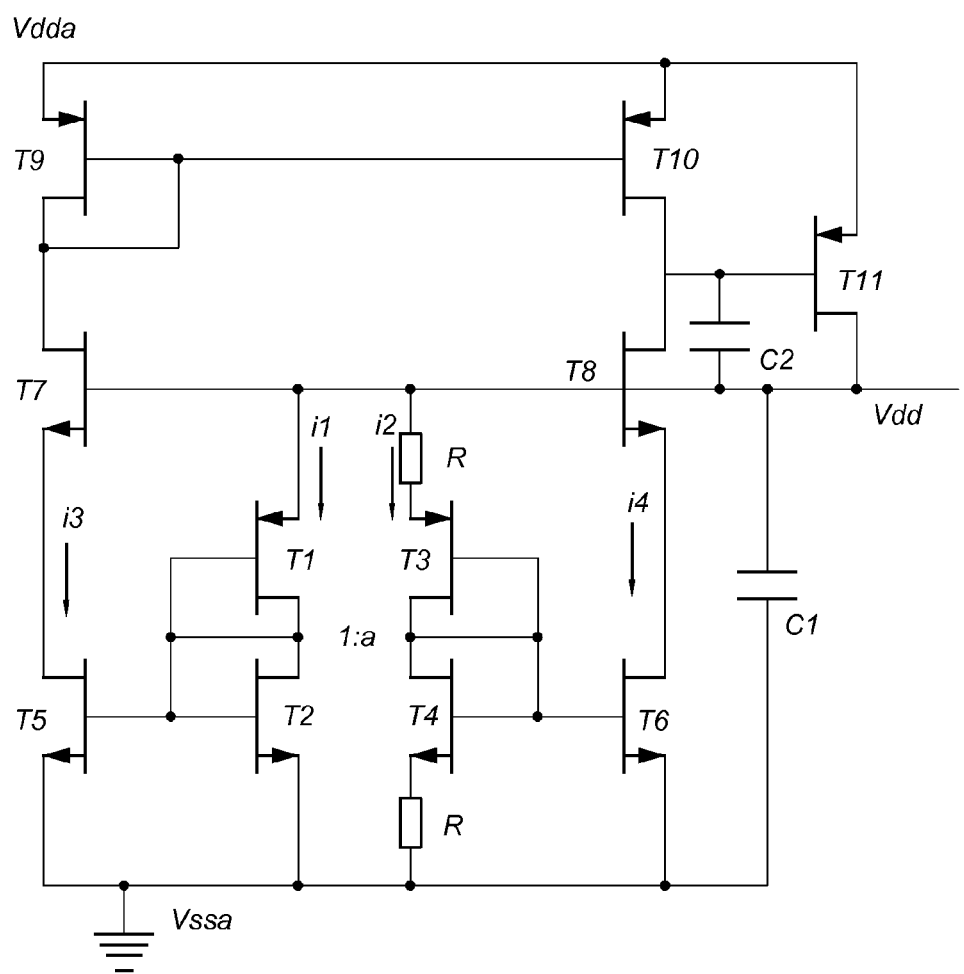
Figure 3:
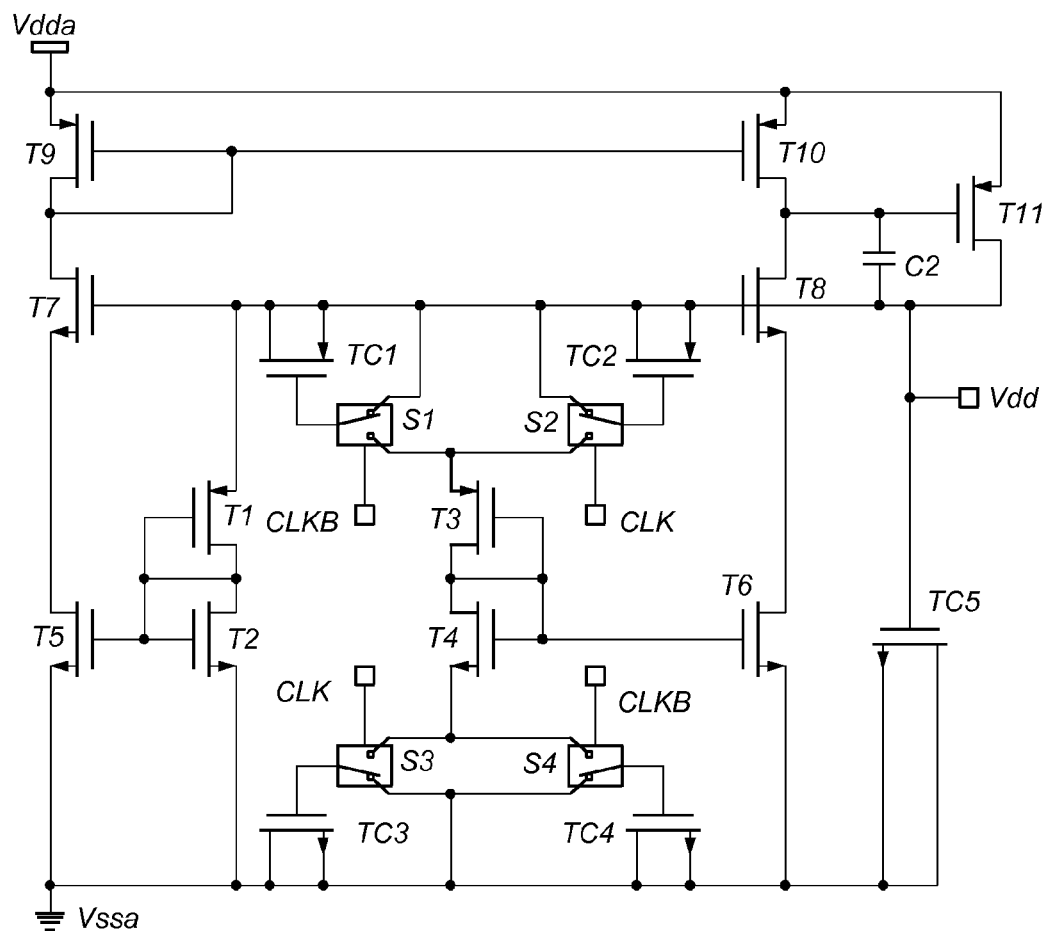

The present invention will be discussed in more detail below, using a number of exemplary embodiments, with reference to the attached drawings, in which FIG. 1 shows a schematic electrical diagram of an inverter circuit;

FIG. 2 shows a schematic electrical diagram of a biasing circuit according to an embodiment of the present invention; and FIG. 3 shows a schematic electrical diagram of a biasing circuit according to a further embodiment of the present invention.

DETAILED DESCRIPTION OF EXEMPLARY EMBODIMENTS

The present invention relates to a new biasing circuit and method for CMOS inverter based circuits used in analog signal processing circuits and in particular in gm-C filters. When an inverter (shown schematically in FIG. 1) is used as a gain stage in an analog signal processing unit (such as an amplifier, filter or oscillator), it is important that the transconductance (gm) of the inverter is constant despite processing variations and temperature changes. In current analog signal processing units this has been achieved by control loops using a large amount of additional circuitry. The present invention embodiments present a new biasing method to keep the transconductance (gm) of the inverter constant, thereby avoiding the use of additional control loops. In addition a variant of the biasing circuit using a switched capacitor is presented. With this biasing circuit it is possible to construct (continuous time) gm-C filters that do not need frequency trimming.

FIG. 1 shows an electrical diagram of an inverter circuit for which the present invention embodiments can be used for providing a supply voltage Vdd. The (CMOS) inverter circuit comprises a PMOS transistor Tp and an NMOS transistor Tn, of which the gates are connected to each other, serving as input (Vin as depicted in FIG. 1). The source terminals of the PMOS transistor Tp and NMOS transistor Tn are connected to a power supply (Vdd) and ground, respectively. The drain terminals of the NMOS transistor Tn and PMOS transistor Tp are connected to each other and form an output terminal of the inverter circuit. In this case, the output terminal drives a load capacitor CL (Iout).

The use of a CMOS inverter (see FIG. 1) as an analog gain stage has several advantages. A major advantage is that for the same bias current, the transconductance (gm) is twice as high compared to a single NMOS or PMOS transistor. This holds especially for modern processes where the PMOS and NMOS performance are about equal. This is why nowadays, inverter stages are used quite a lot in analog signal processing circuits, like Low Noise Amplifiers (LNAs) and gm-C filters.

The transconductance gm of the inverter as shown in FIG. 1 is defined at the operating point. This is the input voltage for which the currents through the NMOS transistor Tn and the PMOS transistor Tp are equal (Iout=0). The equation for the transconductance gm will be derived below, using well known CMOS square law transistor formulas.

$$Idn = \frac{K_N}{2}(Vgs_n - Vt_n)^2,$$

where $$K_N = \mu_n \cdot C_{ox} \cdot \frac{W_n}{L_n}$$

$$Idp = \frac{K_P}{2}(Vgs_p - Vt_p)^2,$$

where $$K_P = \mu_p \cdot C_{ox} \cdot \frac{W_p}{L_p}$$

$$Iout = Idn - Idp$$

Because Vgsp=Vin−Vdd and Vgsn=Vin, the relationship will become as follows.

$$Iout = \frac{K_N}{2}(Vin - Vt_n)^2 - \frac{K_P}{2}(Vin - Vdd - Vt_p)^2$$

$$gm_i = \frac{dIout}{dVin}$$

So the transconductance gm of the inverter becomes:

$$gm_i = K_N(Vin - Vt_n) - K_P(Vin - Vdd - Vt_P)$$

When the NMOS transistor Tn and PMOS transistor Tp have equal properties, $Vt_p = -Vt_n = Vt$, and $K_N = K_P = K$, the transconductance gm of the inverter will get the simple relationship:

$$gm_i = 2K(\tfrac{1}{2}Vdd - Vt)$$

It is noted that normally the properties of the NMOS transistor Tn and PMOS transistor Tp are not fully equal. This makes the transconductance gm dependent of the input voltage Vin and Vt, which introduces a distortion. This is however not important for the purpose of the present invention embodiments. The relationship shows that the gm of the inverter depends on the supply voltage (Vdd) and the process properties like $K_N$, $K_P$ and Vt. Because the process properties are temperature dependent, the transconductance gm will also be temperature dependent.

When an inverter is used as gain stage in an analog signal processing circuit, a constant gm is usually required to achieve reliable performance. This invention describes a new biasing method to keep the gm of the inverter constant, which is done by generating a supply voltage Vdd for the inverter, such that the transconductance gm of the inverter is constant over temperature and processing variations.

The biasing circuit according to the present invention embodiments makes use of the fact that transistors that are in the neighborhood of each other on the same piece of silicon (same die) usually have the same process properties. This is called matching.

A particular application area for the present invention embodiments are the so called gm-C filters, which are extensively used in the channel selection filters of radios. An example of a gm-C filter that uses inverters to construct the gm-stages of the filter is presented in e.g. the article by B. Nauta 'A CMOS transconductance-C filter technique for very high frequencies', IEEE J. Solid State Circuits, vol. 27, pp. 142-153, February 1992. These gm-stages are extremely power efficient, due to their lack of internal nodes, and exhibit a large dynamic range, due to their complementary built. They are consequently popular with low-power wireless receivers, as disclosed in the article by Pietro Andreani and Sven Mattisson, "On the use of Nauta's Transconductor in Low-Frequency CMOS gm-C Bandpass Filters", IEEE J. Solid-State Circuits, vol. 37, pp. 114-124, February 2002.

The invention embodiments in general comprise a circuit that generates a voltage biasing Vdd for a connected inverter stage. The properties of the voltage biasing Vdd are such that the resulting transconductance gm of the inverter is constant over temperature and process variations. The inverter is biased through its supply voltage Vdd assuming that the differential input is zero and the common mode nominal. In this case the transconductance gm of the PMOS and NMOS transistors Tp, Tn, constituting the inverter can be related to a resistor.

The current through the inverter (or inverter based circuit) can be related to that of an inverter and a resistor. An embodiment of this complementary constant gm biasing circuit is shown in the electrical schematic diagram of FIG. 2.

The heart of the circuit are the two shorted inverters (INV1=T1, T2 and INV2=T3, T4) and a reference impedance in the form of two resistors (R). In this respect, the term shorted means that the inverter output (node of drains of transistors T1, T2; T3, T4) is connected to its input (node of gates of transistors T1, T2; T3, T4).

In more general terms, the present invention embodiments relate to a biasing circuit for providing a supply voltage Vdd for an inverter based circuit, wherein the biasing circuit is made on a same die as the inverter based circuit, the biasing circuit comprising a first shorted inverter circuit T1, T2 and a second shorted inverter circuit T3, T4, wherein the first shorted inverter circuit T1, T2 is connected in parallel to a series configuration of the second shorted inverter circuit T3, T4 and a reference impedance R, and the first shorted inverter circuit T1, T2 and second shorted inverter circuit T3, T4 have different transistor geometries, further comprising a control circuit T5-T11 connected to the first shorted inverter circuit T1, T2 and the second shorted inverter circuit T3, T4, and supplied with a main supply voltage Vdda, the control circuit T5-T11 being arranged such that an equal current i1, i2 flows through the first shorted inverter circuit T1, T2 and second shorted inverter circuit T3, T4.

The first shorted inverter circuit T1, T2 and the second shorted inverter circuit T3, T4 comprise a PMOS transistor T1; T3 and a NMOS transistor T2; T4 connected to each other with their drain terminals and gate terminals.

The reference impedance in the embodiment shown in FIG. 2 comprises two resistors with the same impedance R.

In the biasing circuit, the different transistor geometries determine a ratio in number of instances of first shorted inverter circuit T1, T2 and second shorted inverter circuit T3, T4, with a ratio 1:a. In the embodiment shown in FIG. 2, this ratio is indicated as 1:a, as the inverters consist of a number of unit instances, and the second inverter T3, T4 has 'a' times the number of unit instances of the first inverter T1, T2. The ratio in number of instances can e.g. be implemented by using different W/L dimensions of the transistors in the first (T1, T2) and second (T3, T4) shorted inverter circuits In an embodiment of the invention, the inverter based circuit comprises CMOS transconductance stages using inverters, wherein a transconductance parameter (gm) is determined according to the formula $$gm = \frac{2(\sqrt{a} - 1)}{\sqrt{a}\,R},$$

wherein 'a' is the ratio and R is the reference impedance value.

One can calculate that when the voltage (Vdd) applied to the inverters T1, T2; T3, T4 and the resistors R is such that the currents i1 and i2 are equal, the transconductance gm of the first shorted inverter T1, T2 gets a relation according to the formula just above, where 'a' is the ratio of the number of instances between the two current branches i1, i2. From the formula it is clear that the transconductance gm of the inverter T1, T2 does not depend on the MOS device properties, but only on the resistor R. Selecting a resistor with a low temperature coefficient ensures that the gain of the inverter T1, T2 is kept constant over temperature. When the voltage Vdd is applied as supply voltage to other inverters located on the same silicon die, these inverters will have a constant transconductance gm.

The rest of the transistors in the circuit shown in FIG. 2 are there to make the currents i1, i2 equal. Transistor T5 and T6 are current mirrors to make a copy of the currents i1 and i2 (i.e. currents i3 and i4), and transistors T7, T8, T9, T10 and T11 form a feedback amplifier configuration (also known as 'nullor' circuit) with i3 and i4 as input currents and Vdd as output voltage.

In more general wording the control circuit of the biasing circuit comprises two current mirrors T5, T6 and a feedback amplifier configuration circuit T5-T11. The current mirrors comprise a transistor T5, T6, of which the gate terminal and source terminal are connected to the gate terminal and source terminal, respectively, of a transistor in each of the first shorted inverter circuit T1, T2 and the second shorted inverter circuit T3, T4. The feedback amplifier configuration circuit of the biasing circuit comprises a nullor circuit (T7-T11), having currents i3, i4 through the current mirrors T5, T6 as input and the supply voltage (Vdd) as output.

In the biasing circuit embodiment of FIG. 2 the feedback amplifier configuration circuit (T5-T11) further comprises a compensation capacitor C2. This ensures that the bias output impedance is kept low for high frequencies.

Furthermore, in the FIG. 2 embodiment, the biasing circuit further comprises an output capacitor C1 (between Vdd and Vssa).

A further group of embodiments can be advantageously applied for providing the supply voltage Vdd to gm-C filters. In gm-C filters, the frequency response of the filter is determined by the gm-C ratio. To make reliable filters, the ratio of transconductance gm and C should therefore be kept constant. In this group of embodiments a switched capacitor type of reference impedance is provided. This can be used to make gm-C filters that do not require any tuning or trimming.

When the biasing circuit of FIG. 2 is used for the biasing of transconductor cells in a gm-C filter, trimming of the resistor R might be needed to accommodate for process variations in the capacitor (Ratio of gm and C should be constant).

To completely avoid trimming of gm-C filters, the reference resistor R in the biasing circuit (i.e. the resistors R in the second shorted inverter circuit T3, T4 branch) can be replaced by a switched capacitor, switched by an accurate reference clock. In other words the reference impedance comprises switched capacitors.

This is implemented in the exemplary embodiment shown in the electrical diagram of FIG. 3. The upper resistor R in the second shorted inverter circuit T3, T4 has been replaced by a parallel circuit of a first and second switch S1, S2, and two capacitive transistors TC1 and TC2, wherein the switches S1, S2 are complementary switching the capacitive transistors TC1, TC2 in series or short circuit by a clock signal CLK and inverted clock signal CLKB, respectively. A similar arrangement has been made to replace the resistor R in the lower part, using a third and fourth switch S3, S4 and third and fourth capacitive transistor TC3, TC4.

When the capacitors in the filter and the biasing circuit are matched, the frequency of the filter does not need to be trimmed.

As shown in the embodiment of FIG. 3, the output capacitor C2 may be replaced by a further capacitive transistor TC5, of which the source and drain are connected to ground (Vssa).

As noted above, there is an increase in the use of CMOS inverters for analog signal processing. The main reason behind this is that they are very suitable for the low supply voltages of modern technologies and the circuits are also easy to transfer to a new technology node. Analog gain stages built of inverters can therefore be found in oscillators, filters, LNAs, ADCs, DACs etc. The invention therefore has a large potential use in various applications. When the circuit variant with a switched capacitor is used to generate the biasing of a so called gm-C filter (present in most modern receiver front-ends as channel filter or anti aliasing filter), tuning or trimming of the filter is no longer needed which is a major advantage with respect to current solutions. According to further embodiments of the present invention, a combination of a biasing circuit according to any one of the embodiments described above and an inverter based circuit comprising CMOS transconductance stages is provided. The inverter based circuit may e.g. comprise a CMOS inverter or a gm-C filter circuit.

The present invention embodiments have been described above with reference to a number of exemplary embodiments as shown in the drawings. Modifications and alternative implementations of some parts or elements are possible, and are included in the scope of protection as defined in the appended claims.

The invention claimed is:

1. A biasing circuit for providing a supply voltage for an inverter based circuit,
wherein the biasing circuit is provided on a same die as the inverter based circuit,
the biasing circuit comprising a first shorted inverter circuit and a second shorted inverter circuit,
wherein the first shorted inverter circuit is connected in parallel to a series configuration of the second shorted inverter circuit and a reference impedance,
and the first shorted inverter circuit and second shorted inverter circuit have different transistor geometries,
further comprising a control circuit connected to the first shorted inverter circuit and the second shorted inverter circuit, and supplied with a main supply voltage,
the control circuit being arranged such that an equal current flows through the first shorted inverter circuit and second shorted inverter circuit.

2. The biasing circuit of claim 1, wherein the first shorted inverter circuit and the second shorted inverter circuit comprise a PMOS transistor and a NMOS transistor connected to each other with their drain terminals and gate terminals.

3. The biasing circuit of claim 1, wherein the different transistor geometries determine a ratio in number of instances of first and second shorted inverter circuit.

4. The biasing circuit of claim 1, wherein the inverter based circuit comprises CMOS transconductance stages using inverters, wherein a transconductance parameter is determined according to $$gm = \frac{2(\sqrt{a}-1)}{\sqrt{a}\,R},$$

wherein 'a' is the ratio and R is the reference impedance value.

5. The biasing circuit of claim 1, wherein the control circuit comprises two current mirrors and a feedback amplifier configuration circuit.

6. The biasing circuit of claim 5, wherein the current mirrors comprise a transistor of which the gate terminal and source terminal are connected to the gate terminal and source terminal, respectively, of a transistor in each of the first shorted inverter circuit and the second shorted inverter circuit.

7. The biasing circuit of claim 5, wherein the feedback amplifier configuration circuit comprises a nullor circuit, having currents through the current mirrors as input and the supply voltage as output.

8. The biasing circuit of claim 5, wherein the feedback amplifier configuration circuit comprises a compensation capacitor.

9. The biasing circuit of claim 1, further comprising an output capacitor.

10. The biasing circuit of claim 1, wherein the reference impedance comprises two resistors with impedance R.

11. The biasing circuit of claim 1, wherein the reference impedance comprises switched capacitors.

12. A combination of a biasing circuit and an inverter based circuit comprising CMOS transconductance stages,
  wherein the biasing circuit is arranged for providing a supply voltage for an inverter based circuit,
  wherein the biasing circuit is provided on a same die as the inverter based circuit,
  the biasing circuit comprising a first shorted inverter circuit and a second shorted inverter circuit,
  wherein the first shorted inverter circuit is connected in parallel to a series configuration of the second shorted inverter circuit and a reference impedance,
  and the first shorted inverter circuit and second shorted inverter circuit have different transistor geometries,
  further comprising a control circuit connected to the first shorted inverter circuit and the second shorted inverter circuit, and supplied with a main supply voltage,
  the control circuit being arranged such that an equal current flows through the first shorted inverter circuit and second shorted inverter circuit.

13. The combination of claim 12, wherein the inverter based circuit comprises a CMOS inverter.

14. The combination of claim 12, wherein the inverter based circuit comprises a gm-C filter circuit.

* * * * *